(12) United States Patent
Rankin

(10) Patent No.: US 8,465,885 B2
(45) Date of Patent: Jun. 18, 2013

(54) BOUNDARY LAYER FORMATION AND RESULTANT STRUCTURES

(75) Inventor: Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 13/021,852

(22) Filed: Feb. 7, 2011

(65) Prior Publication Data

US 2012/0202139 A1  Aug. 9, 2012

(51) Int. Cl.
*G03F 1/68* (2012.01)

(52) U.S. Cl.
USPC .............................................. 430/5

(58) Field of Classification Search
USPC ............... 430/5, 322, 323, 311, 312, 394
See application file for complete search history.

(56) References Cited

U.S. PATENT DOCUMENTS

| 5,484,672 | A | 1/1996 | Bajuk et al. |
| 5,620,817 | A | 4/1997 | Hsu et al. |
| 6,007,324 | A | 12/1999 | Tzu et al. |
| 6,120,942 | A | 9/2000 | Reinberg |
| 6,524,755 | B2 | 2/2003 | Jin et al. |
| 6,593,033 | B1 | 7/2003 | Ma et al. |
| 6,682,860 | B2 | 1/2004 | Angelopoulos et al. |
| 6,730,445 | B2 | 5/2004 | Angelopoulos et al. |
| 7,037,626 | B2 | 5/2006 | Dirksen et al. |
| 7,049,034 | B2 | 5/2006 | Martin et al. |
| 2003/0013023 | A1* | 1/2003 | Chan ................................. 430/5 |
| 2009/0104543 | A1* | 4/2009 | Park ................................. 430/5 |

* cited by examiner

*Primary Examiner* — Stephen Rosasco

(74) *Attorney, Agent, or Firm* — Cantor Colburn LLP; Richard Kotulak

(57) ABSTRACT

A method for forming anti-boundary layer patterns includes patterning a first masking layer on a chrome layer, etching to remove portions of the chrome layer and expose portions of a first quartz layer, removing the first masking layer, patterning a second masking layer on portions of the chrome layer and the first quartz layer, and etching to remove exposed portions of the first quartz layer and to expose portions of an etch stop layer to define anti-boundary layers defined by the first quartz layer and the etch stop layer.

20 Claims, 8 Drawing Sheets

BOUNDARY LAYER FORMATION AND RESULTANT STRUCTURES

BACKGROUND

The present invention relates to photolithographic processes, and more specifically, to photolithographic process used to form boundary layers in integrated circuit devices.

Photolithographic processes are often used to fabricate a variety of integrated circuit devices. In fabricating integrated circuit devices, photolithographic masks are used to define features in the devices. Electromagnetic frequency models may be used to simulate optical and physical interactions in the fabrication process. In photolithographic processes that use a high angle of incidence of light onto a mask, completely modeling the process may consume considerable computational resources.

Anti-boundary layers or rim shifters are features that may be formed in a photomask device that improve the effectiveness of the photolithographic process. The inclusion of anti-boundary layers in a photomask device design allows the use of thin mask approximation models that consume less computational resources than other model methods. Thus, a method for forming anti-boundary layers on photomasks using a photolithographic process is desired.

BRIEF SUMMARY

According to one embodiment of the present invention, a method for forming anti-boundary layer patterns includes patterning a first masking layer on a chrome layer, etching to remove portions of the chrome layer and expose portions of a first quartz layer, removing the first masking layer, patterning a second masking layer on portions of the chrome layer and the first quartz layer, and etching to remove exposed portions of the first quartz layer and to expose portions of an etch stop layer to define anti-boundary layers defined by the first quartz layer and the etch stop layer.

According to another embodiment of the present invention, a method for forming anti-boundary layer features includes patterning a first masking layer on a chrome layer, etching to remove portions of the chrome layer and a phase shift layer, and expose portions of a first quartz layer, removing the first masking layer, patterning a second masking layer on portions of the chrome layer and the first quartz layer, etching to remove exposed portions of the first quartz layer and to expose portions of an etch stop layer to define anti-boundary layers defined by the first quartz layer and the etch stop layer, removing the second masking layer, patterning a third masking layer on portions of the chrome layer and the first quartz layer, and etching to remove exposed portions of the chrome layer.

According to another embodiment of the present invention, a method for forming anti-boundary layer feature includes patterning a first masking layer on a chrome layer, etching to remove portions of the chrome layer and expose portions of a first quartz layer, removing the first masking layer, patterning a second masking layer on portions of the chrome layer and the first quartz layer, etching to remove exposed portions of the first quartz layer and to expose portions of a first etch stop layer to define a cavities defined by the first quartz layer and the first etch stop layer, patterning a third masking layer on portions of the first etch stop layer, etching to remove exposed portions of the first etch stop layer and a second quartz layer, and removing the third masking layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 illustrates an arrangement of quartz and chrome materials;

FIG. 2 illustrates the patterning of a masking layer;

FIG. 3 illustrates the resultant structure following the removal of the exposed portions of the chrome layer;

FIG. 4 illustrates the resultant structure following the deposition and patterning of a second photoresist masking layer;

FIG. 5 illustrates the formation of anti-boundary layer features; and

FIG. 6 illustrates the resultant structure following the removal of the second photoresist masking layer.

FIG. 7 illustrates an arrangement of quartz and chrome materials;

FIG. 8 illustrates the resultant structure following the patterning of a masking layer;

FIG. 9 illustrates the resultant structure following the removal of the exposed portions of the chrome layer;

FIG. 10 illustrates the resultant structure following the deposition and patterning of a second photoresist masking layer;

FIG. 11 illustrates the formation of anti-boundary layer features; and

FIG. 12 illustrates the resultant structure following the deposition and patterning of a third photoresist masking layer.

FIG. 13 illustrates an arrangement of quartz and chrome materials;

FIG. 14 illustrates the resultant structure following the patterning of a masking layer;

FIG. 15 illustrates the resultant structure following the removal of portions of the chrome layer;

FIG. 16 illustrates the resultant structure following the removal of portions of the quartz layer;

FIG. 17 illustrates the formation and patterning of a second photoresist masking layer;

FIG. 18 illustrates the resultant structure following removal of portions of the quartz layer;

FIG. 19 illustrates the resultant structure following the removal of the masking layer;

FIG. 20 illustrates the resultant structure following the formation and patterning of a third photoresist masking layer;

FIG. 21 illustrates the resultant structure following the removal of exposed portions of the chrome layer; and FIG. 22 illustrates the resultant structure following the removal of the masking layer.

DETAILED DESCRIPTION

Figure 1:
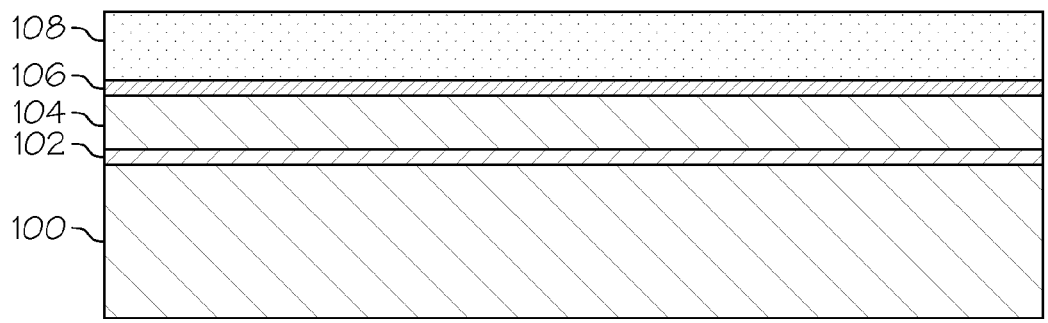
FIGS. 1-6 illustrate side cut-away views of an exemplary method for forming anti-boundary layer features on a photomask, in this regard.

FIGS. 1-6 illustrate side cut-away views of an exemplary method for forming anti-boundary layers in a quartz material. Referring to FIG. 1, an etch stop layer 102 is disposed on a quartz layer 100. The etch stop layer 102 may include, for example, thin chrome material, carbon material, $MgF_x$, $Al_xO_3$, or $Al_xN_y$ that may form a discrete layer, alternatively, the etch stop layer 102 may include quartz, or other substrate material that is doped with a material such hafnium, carbon, phosphorous, or other material recognized by those skilled in the art. A quartz layer 104 is disposed on the etch stop layer 102, and a chrome layer 106 is disposed on the quartz layer 104. The quartz layer 100, etch stop layer 102 and quartz layer 104 are effectively transparent with a transparency of approximately 98%. The illustrated embodiment includes a first photoresist masking layer (masking layer) 108 that is formed on the chrome layer 106, and may be formed from, for example, an organic polymer material.

Figure 2:
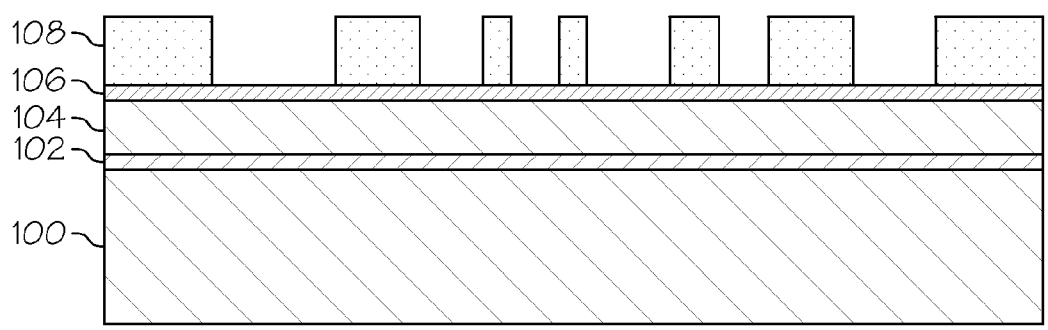

FIG. 2 illustrates the resultant structure of the masking layer 108 following the patterning of the masking layer 108 using a lithographic patterning process that exposes portions of the chrome layer 106.

Figure 3:
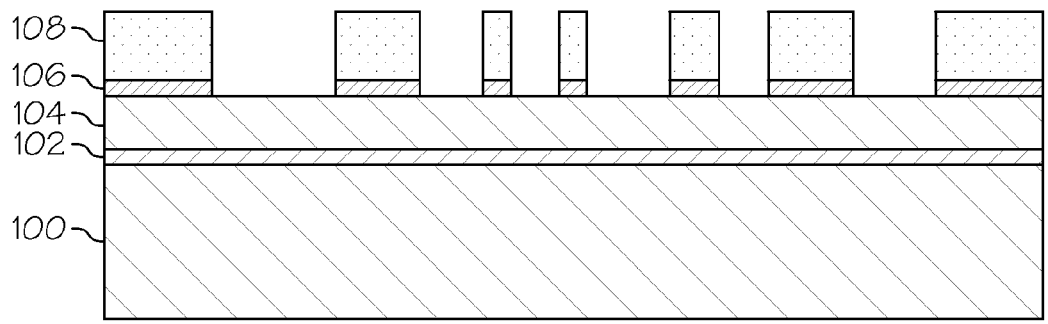

FIG. 3 illustrates the resultant structure following the removal of the exposed portions of the chrome layer 106, which exposes portions of the quartz layer 104 using for example, a reactive ion etching (RIE) process or a wet chemical etching process, such as aqueous hydrofluoric acid. Following the etching process, the masking layer 108 may be removed using, for example, a wet etching or other suitable removal process.

Figure 4:
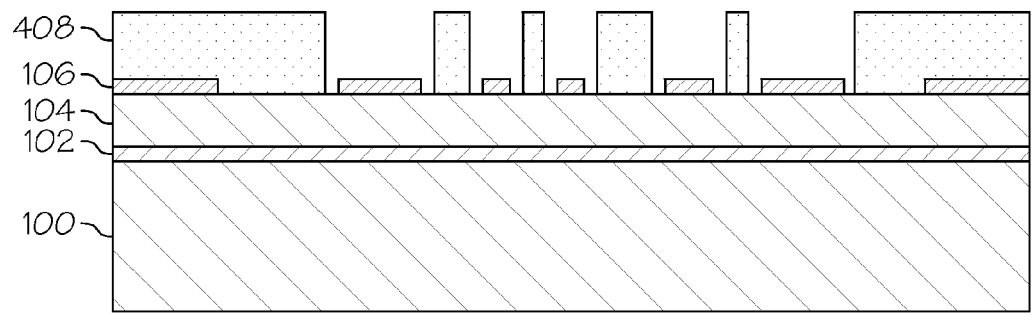

FIG. 4 illustrates the resultant structure following the deposition and patterning of a second photoresist masking layer 408 that obscures portions of the chrome layer 106 and the quartz layer 104.

Figure 5:
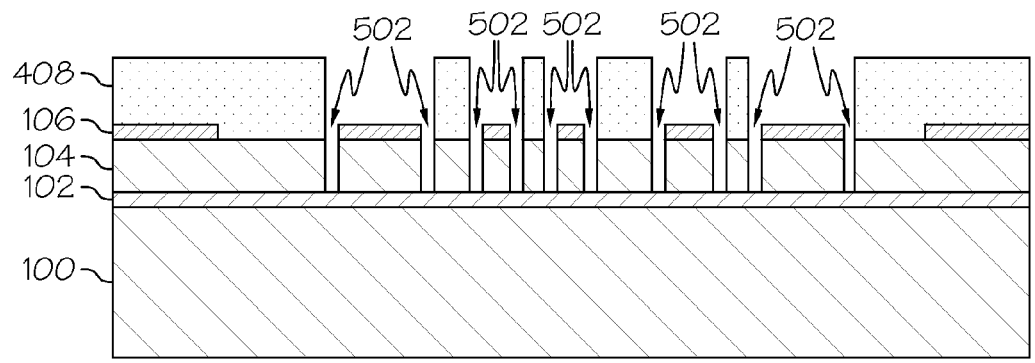

FIG. 5 illustrates the formation of anti-boundary layer features (rim shifters) 502. The anti-boundary layer features 502 are formed by an etching process such as, for example, an RIE process that removes exposed portions of the quartz layer 104. The RIE process is operative to remove the exposed quartz material 104 until the etch stop layer 102 is exposed and partially etched. The partial etching of the etch stop layer 102 results in materials in the etch stop layer 102 being introduced into the mixture of gasses in the processing chamber (not shown). The detection of the etch stop layer 102 material in the processing chamber indicates that the etch stop layer 102 has been exposed, and provides feedback to stop the RIE process. Thus, the etch stop layer 102 allows the depth of the anti-boundary layers to be determined and controlled.

Figure 6:
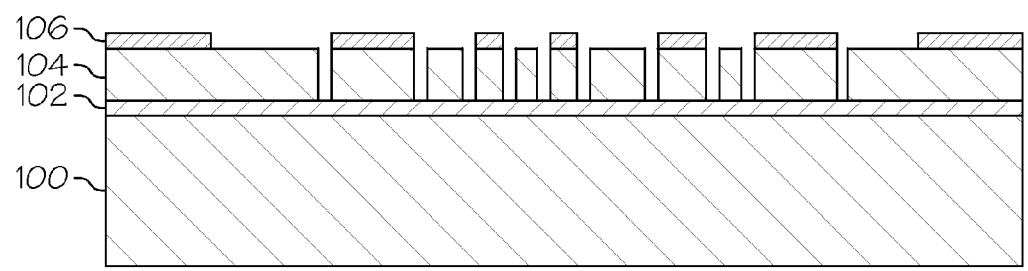

FIG. 6 illustrates the resultant structure following the removal of the second photoresist masking layer 408 (of FIG. 5).

Figure 7:
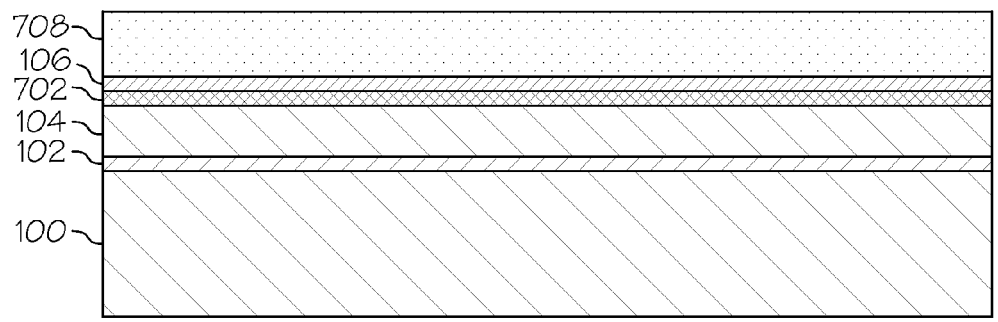
FIGS. 7-12 illustrate side cut-away views of an alternate exemplary method for forming anti-boundary layer features, in this regard.

FIGS. 7-12 illustrate side cut-away views of an alternate exemplary method for forming anti-boundary layer features. Referring to FIG. 7, an etch stop layer 102 is disposed on a quartz layer 100; and a quartz layer 104 is disposed on the etch stop layer 102. A phase shift layer 702 is disposed on the quartz layer 104. The phase shift layer 702 may include, for example, silicon, molybdenum silicide, carbon, or silicon oxynitride material. The phase shift layer 702 is partially opaque with 6-20% light transmission, and is operative to shift the phase of light passing through the layer 702 by, for example, 90°, 180° or 270°. A chrome layer 106 is disposed on the phase shift layer 707. The illustrated embodiment includes a first photoresist masking layer 708 that has been formed on the chrome layer 106.

Figure 8:
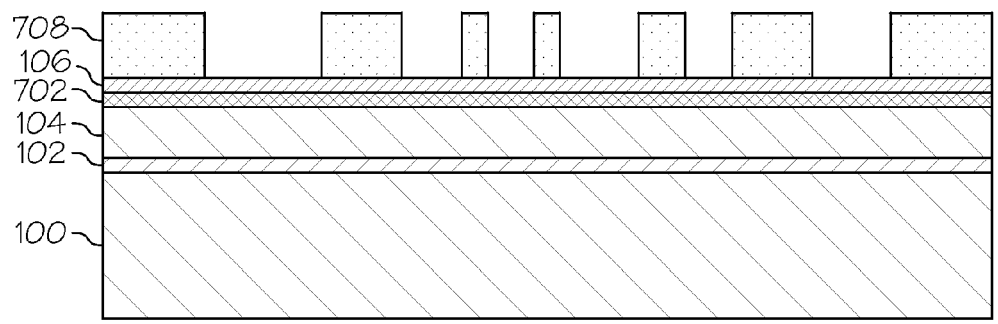

FIG. 8 illustrates the resultant structure following the patterning of the masking layer 708 resulting in the exposure of portions of the chrome layer 106.

Figure 9:
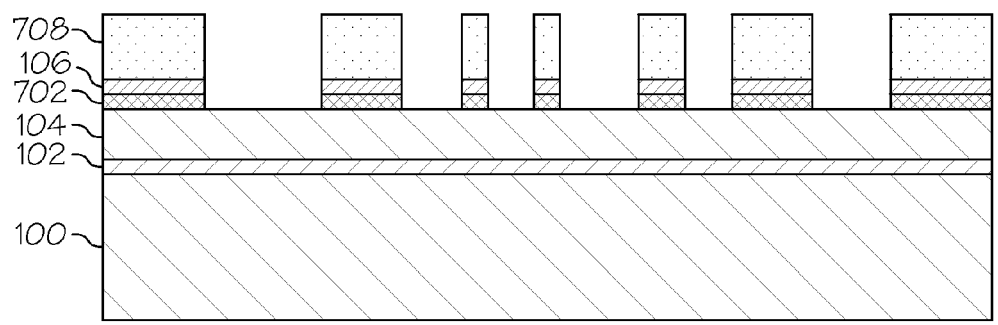

FIG. 9 illustrates the resultant structure following the removal of the exposed portions of the chrome layer 106 and the phase shift layer 102 using, for example, a RIE or wet etching process. The etching process exposes portions of the quartz layer 104. Following the etching process, the masking layer 708 may be removed.

Figure 10:
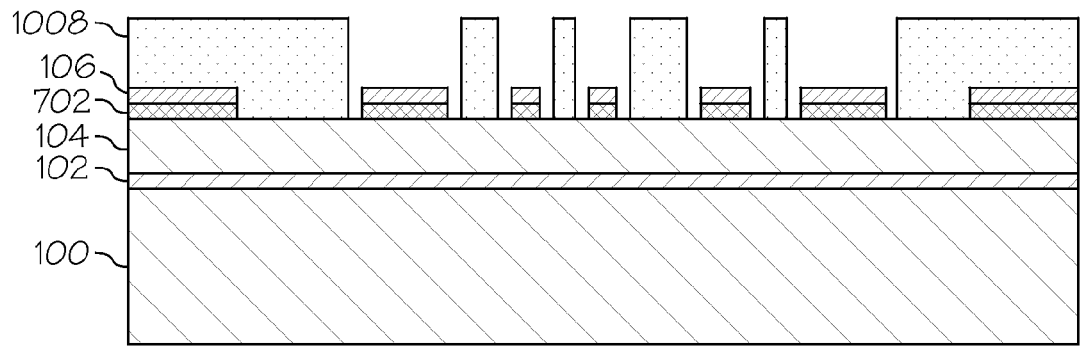

FIG. 10 illustrates the resultant structure following the deposition and patterning of a second photoresist masking layer 1008 that obscures portions of the chrome layer 106 and the quartz layer 104.

Figure 11:
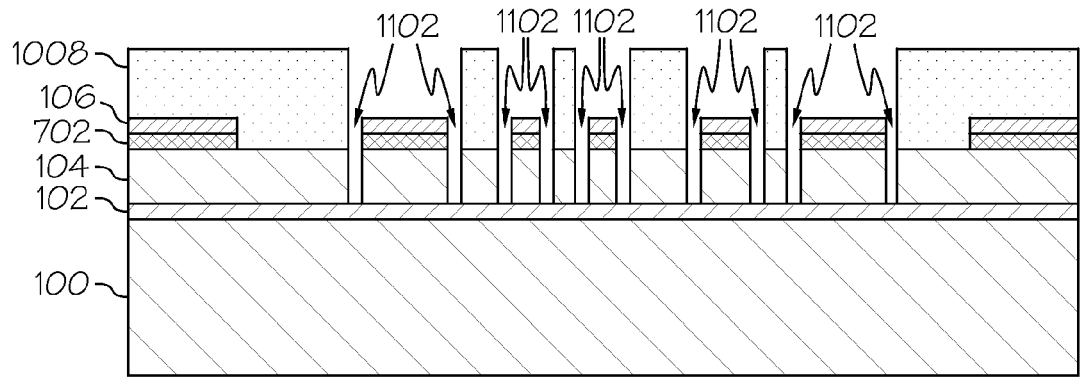

FIG. 11 illustrates the formation of anti-boundary layer features (rim shifters) 1102. The anti-boundary layers 1102 are formed by an etching process such as, for example, an RIE process that removes exposed portions of the quartz layer 104. The RIE process is operative to remove the exposed quartz material 104 until the etch stop layer 102 is exposed in a similar manner as described above. Following the etching process, the masking layer 1008 may be removed.

Figure 12:
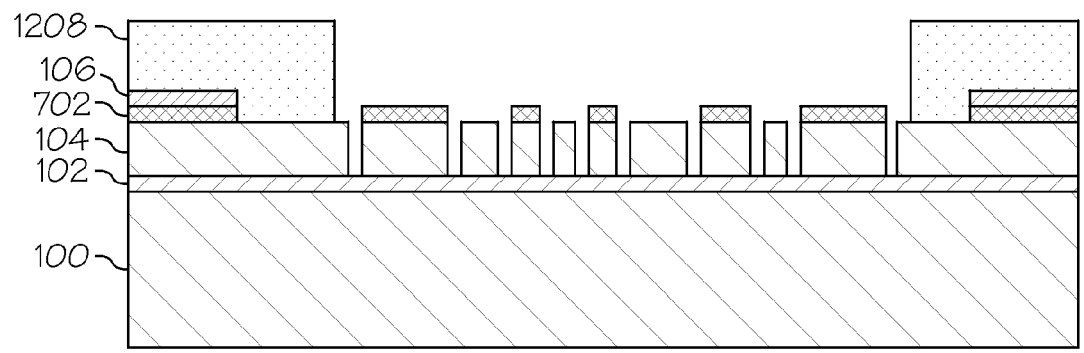

FIG. 12 illustrates the resultant structure following the deposition and patterning of a third photoresist masking layer 1208 that obscures portions of the chrome layer 106 and (in some embodiments) portions of the quartz layer 104. Following the patterning of the masking layer 1208, an etching process, such as, for example, a wet etching process is performed that removes exposed portions of the chrome layer 106. Following the etching process, the masking layer 1208 may be removed.

Figure 13:
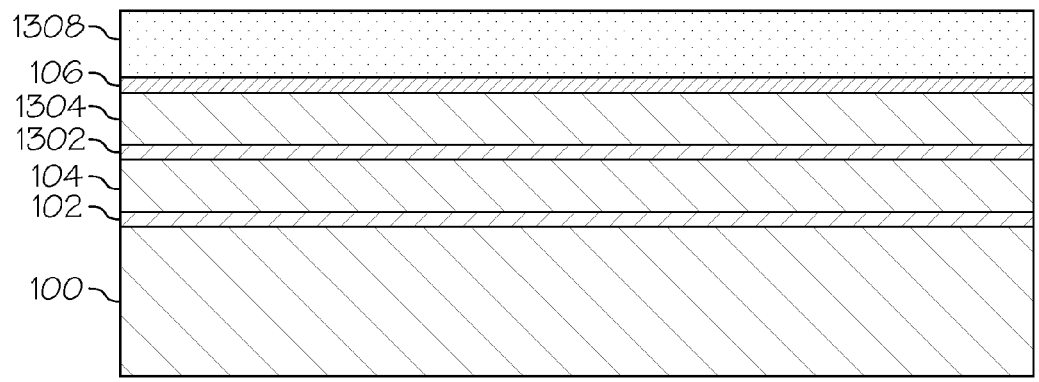
FIGS. 13-22 illustrate side cut-away views of another alternate exemplary method for forming anti-boundary layer features, in this regard.

FIGS. 13-22 illustrate side cut-away views of another alternate exemplary method for forming anti-boundary layer features. Referring to FIG. 13, an etch stop layer 102 is disposed on a quartz layer 100; and a quartz layer 104 is disposed on the etch stop layer 102. An etch stop layer 1302 is disposed on the quartz layer 104, and a quartz layer 1304 is disposed on the etch stop layer 1302. A chrome layer 106 is disposed on the quartz layer 1304. The illustrated embodiment includes a first photoresist masking layer 1308 that is formed on the chrome layer 106.

Figure 14:
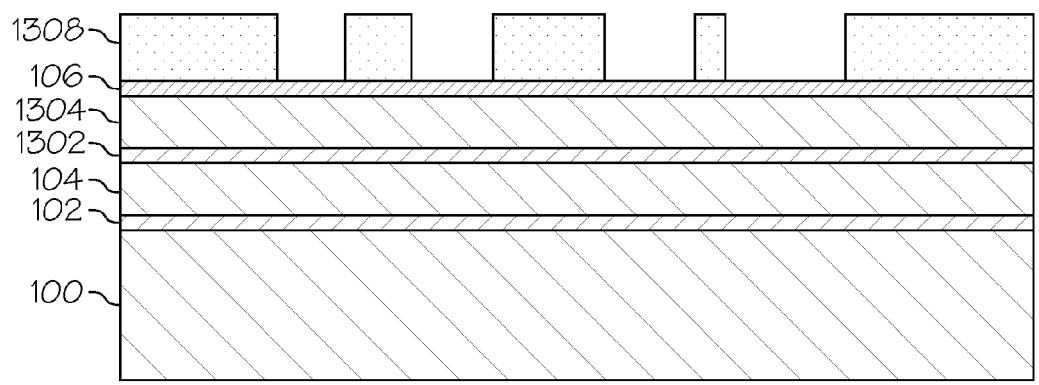

FIG. 14 illustrates the resultant structure following the patterning of the masking layer 1308 resulting in the exposure of portions of the chrome layer 106.

Figure 15:
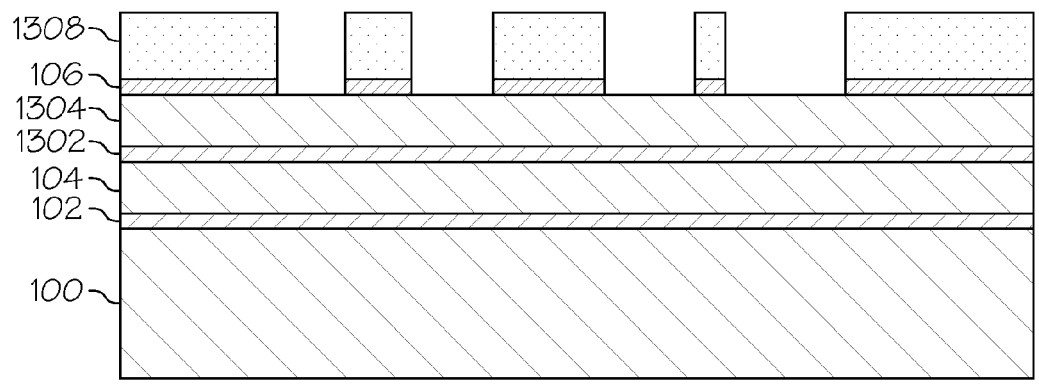

FIG. 15 illustrates the resultant structure following the removal of portions of the chrome layer 106 using, for example, an RIE or wet etching process that exposes portions of the quartz layer 1304.

Figure 16:
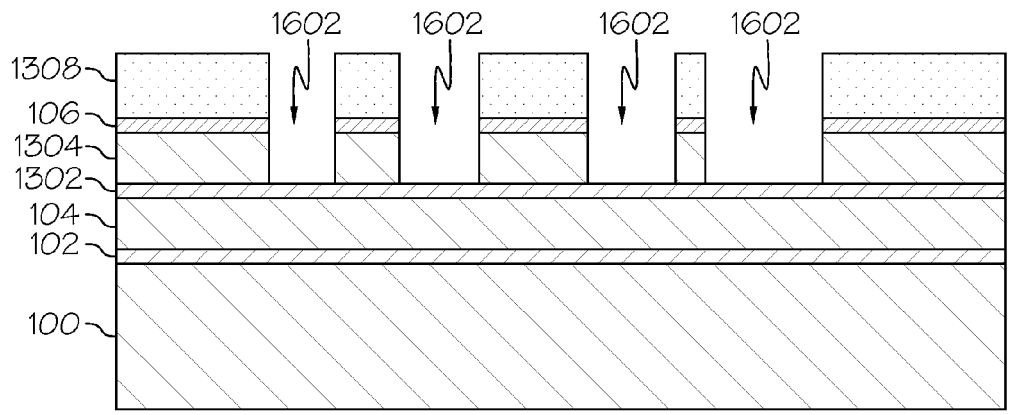

FIG. 16 illustrates the resultant structure following the removal of portions of the quartz layer 1304 using an RIE process that exposes portions of the etch stop layer 1302 in a similar manner as described above resulting in cavities 1602 that are partially defined by the etch stop layer 1302 and the quartz layer 1304. Following the etching process the masking layer 1308 may be removed.

Figure 17:
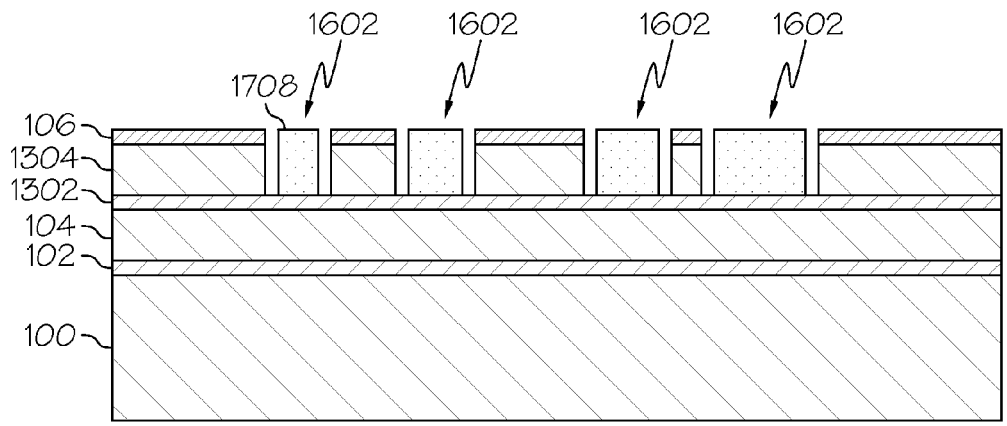

FIG. 17 illustrates the formation and patterning of a second photoresist masking layer 1708 on portions of the etch stop layer 1302 in the cavities 1502. The formation of the second photoresist masking layer 1708 may include, for example, a spin-cote deposition and lithographic patterning method.

Figure 18:
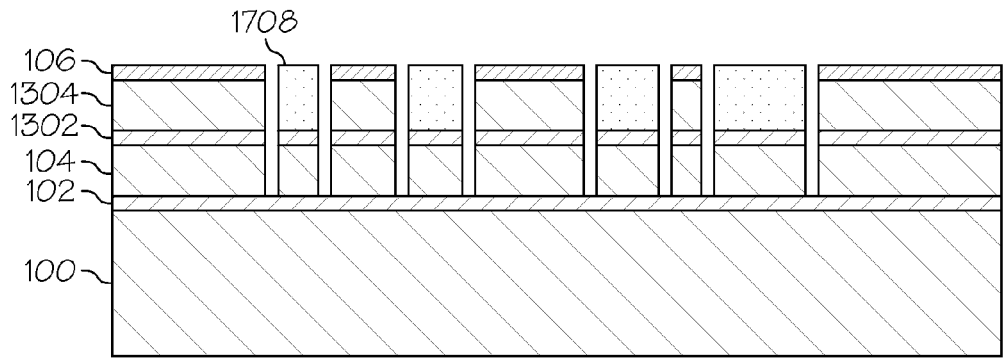

FIG. 18 illustrates the resultant structure following an RIE process that removes the exposed portions of the etch stop layer 1302 and portions of the quartz layer 104. The etching process is operative to cease etching when the etch stop layer 102 is exposed.

Figure 19:
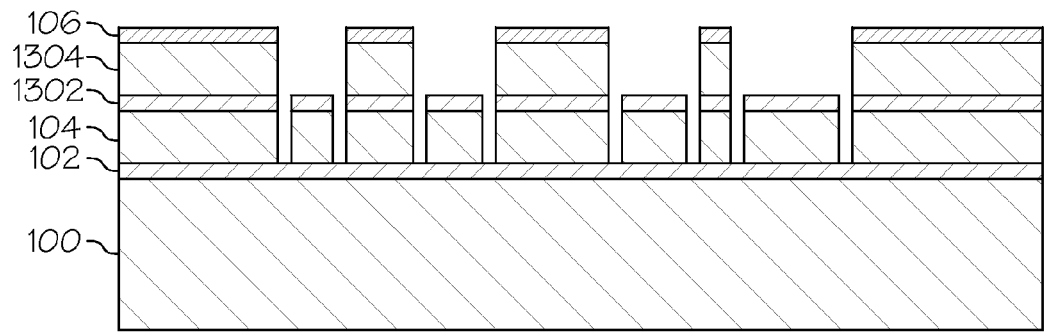

FIG. 19 illustrates the resultant structure following the removal of the masking layer 1708 (of FIG. 18).

Figure 20:
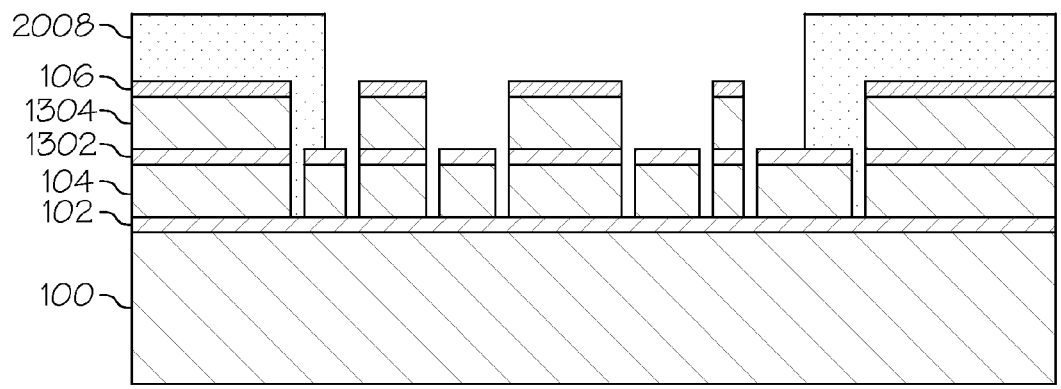

In some embodiments, such as, for example, a chromeless phase shift lithographic process, it may be desirable to remove portions of the chrome layer 106. In this regard, FIG. 20 illustrates the resultant structure following the formation and patterning of a third photoresist masking layer 2008 that obscures portions of the chrome layer 106.

Figure 21:
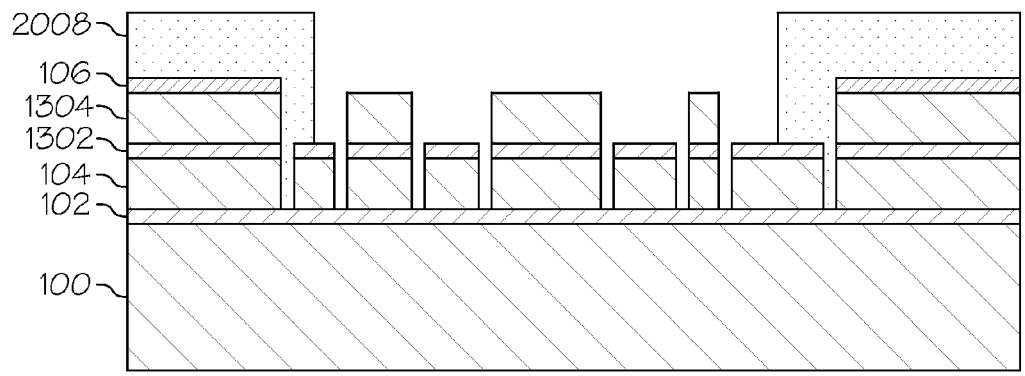

FIG. 21 illustrates the resultant structure following the removal of exposed portions of the chrome layer 106 using, for example, an RIE or wet etching process.

Figure 22:
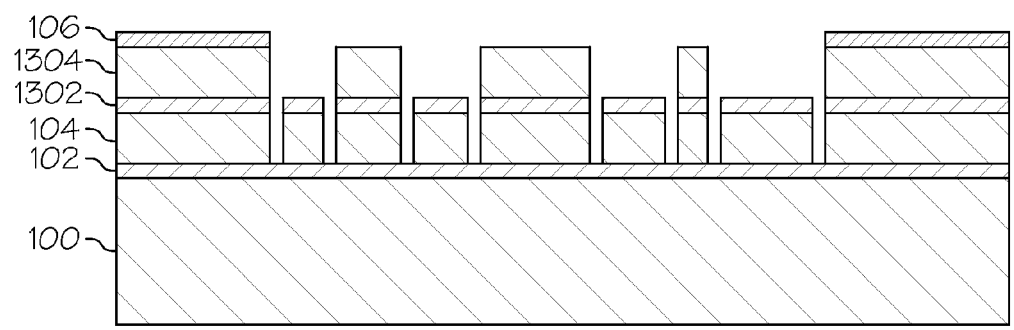

FIG. 22 illustrates the resultant structure following the removal of the masking layer 2008 (of FIG. 21).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming anti-boundary layer patterns, the method comprising:
   patterning a first masking layer on a chrome layer;
   etching to remove portions of the chrome layer and expose portions of a first quartz layer;
   removing the first masking layer;
   patterning a second masking layer on portions of the chrome layer and the first quartz layer; and
   etching to remove exposed portions of the first quartz layer and to expose portions of an etch stop layer to define anti-boundary layers defined by the first quartz layer and the etch stop layer.

2. The method of claim 1, wherein the etch stop layer is disposed on a second quartz layer.

3. The method of claim 1, wherein the etching to remove exposed portions of the first quartz layer includes a reactive ion etching process.

4. The method of claim 1, wherein the first masking layer and the second masking layer are patterned with a photolithographic process.

5. An anti-boundary layer feature arrangement fabricated by the method of claim 1.

6. A method for forming anti-boundary layer features, the method comprising:
   patterning a first masking layer on a chrome layer;
   etching to remove portions of the chrome layer and a phase shift layer, and expose portions of a first quartz layer;
   removing the first masking layer;
   patterning a second masking layer on portions of the chrome layer and the first quartz layer;
   etching to remove exposed portions of the first quartz layer and to expose portions of an etch stop layer to define anti-boundary layers defined by the first quartz layer and the etch stop layer;
   removing the second masking layer;
   patterning a third masking layer on portions of the chrome layer and the first quartz layer; and
   etching to remove exposed portions of the chrome layer.

7. The method of claim 6, wherein the etch stop layer is disposed on a second quartz layer.

8. The method of claim 6, wherein the etching to remove exposed portions of the first quartz layer includes a reactive ion etching process.

9. The method of claim 6, wherein the first masking layer and the second masking layer are patterned with a photolithographic process.

10. An anti-boundary layer arrangement fabricated by the method of claim 6.

11. A method for forming anti-boundary layer feature, the method comprising:
    patterning a first masking layer on a chrome layer;
    etching to remove portions of the chrome layer and expose portions of a first quartz layer;
    removing the first masking layer;
    patterning a second masking layer on portions of the chrome layer and the first quartz layer;
    etching to remove exposed portions of the first quartz layer and to expose portions of a first etch stop layer to define a cavities defined by the first quartz layer and the first etch stop layer;
    patterning a third masking layer on portions of the first etch stop layer;
    etching to remove exposed portions of the first etch stop layer and a second quartz layer; and
    removing the third masking layer.

12. The method of claim 11, wherein the method further includes:
    patterning a fourth masking layer on portions of the chrome layer;
    etching to remove exposed portions of the chrome layer; and
    removing the fourth masking layer.

13. The method of claim 11, wherein the first etch stop layer is disposed on the second quartz layer.

14. The method of claim 11, wherein the second quartz layer is disposed on the second etch stop layer.

15. The method of claim 11, wherein the second etch stop layer is disposed on a third quartz layer.

16. The method of claim 11, wherein the etching to remove exposed portions of the first quartz layer includes a reactive ion etching process.

17. The method of claim 11, wherein the etching to remove exposed portions of the second quartz layer includes a reactive ion etching process.

18. The method of claim 11, wherein the phase shift layer is operative to shift the phase of light transmitted through the phase shift layer.

19. An anti-boundary layer arrangement fabricated by the method of claim 11.

20. An anti-boundary layer arrangement fabricated by the method of claim 12.

* * * * *